United States Patent [19]
DeAngelis et al.

[11] Patent Number: 5,295,522
[45] Date of Patent: Mar. 22, 1994

[54] GAS PURGE SYSTEM FOR ISOLATION ENCLOSURE FOR CONTAMINATION SENSITIVE ITEMS

[75] Inventors: Robert L. DeAngelis, Yorktown Heights; Gary M. Gallagher, Wappingers Falls, both of N.Y.

[73] Assignee: International Business Machines Corporation, Armonk, N.Y.

[21] Appl. No.: 949,959

[22] Filed: Sep. 24, 1992

[51] Int. Cl.⁵ .......................... B65B 1/04; H05K 1/00
[52] U.S. Cl. .......................................... 141/98; 141/85; 141/286; 141/383; 414/217; 414/292; 206/334
[58] Field of Search .................. 141/1, 98, 85, 286, 141/383; 414/217-222, 292; 206/334

[56] References Cited
U.S. PATENT DOCUMENTS

| | | | |
|---|---|---|---|
| 4,532,970 | 8/1985 | Tullis et al. | 141/98 |
| 4,724,874 | 2/1988 | Parikh et al. | 141/98 |
| 4,797,054 | 1/1989 | Arii | 414/217 |
| 4,995,430 | 2/1991 | Bonora et al. | 141/98 |
| 5,137,063 | 8/1992 | Foster et al. | 141/98 |
| 5,217,053 | 6/1993 | Foster et al. | 141/98 |

*Primary Examiner*—Ernest G. Cusick
*Attorney, Agent, or Firm*—Graham S. Jones, II; Harold Huberfeld

[57] ABSTRACT

A reusable isolation enclosure has a closure member adapted for purging gases from the enclosure. The closure member includes filters and vapor and moisture drains. Replacement of ambient environmental gases in the sealed enclosure is provided. A purge gas is provided by the gas replacement system which quickly connects to the enclosure and quickly disconnects from the enclosure. Suction cups surrounding the ends of gas connection lines form the interface to the filter membrane and form a sealed connection with the closure member. No other mechanical connection than the suction cups is required. The outlets and inlets of the purging system and the exhausting system are automatically disconnected by a spring valve when the isolation container to be purged is removed. When the closure member of the isolation enclosure is placed upon the purge system the weight of the package compresses the valve spring opening the valves, permitting the purge gas to flow. An empty isolation enclosure has insufficient weight to open the spring actuated valve system. Only enclosures carrying the weight of a product are purged. A flow indicator for measuring the rate of flow of gas through the quick connection means is connected thereto.

12 Claims, 5 Drawing Sheets

GAS PURGE SYSTEM FOR ISOLATION ENCLOSURE FOR CONTAMINATION SENSITIVE ITEMS

CROSS REFERENCE TO RELATED APPLICATIONS

"ISOLATION STRUCTURE FOR CONTAMINATION SENSITIVE ITEMS"; Inventors: L. B. Cook, R. F. Florence, G. M. Gallagher, G. E Johnson and R. W. Sargent; Ser. No. 07/950,110; Filed: Sep. 24, 1992 commonly assigned and filed concurrently herewith (referred to hereinafter as Cook et al.)

"DOOR OPENING SYSTEM AND METHOD"; Inventors: G. M. Gallagher, and G. E. Johnson; Ser. No. 07/949,960; Filed: Sep. 24, 1992 commonly assigned and filed concurrently herewith (referred to hereinafter as Gallagher et al.)

BACKGROUND OF THE INVENTION

1. Field of the Invention

This invention relates to enclosures for the packaging of items in isolation from contamination for use with sensitive items such as electronic components, and more particularly such enclosures including facilities for purging a sealed container.

2. Description of related art.

Packaging is an integral part of the transportation and delivery of products during the course of manufacturing. One important requirement for packaging has been to provide ease of handling and space efficient storage of the product free from contamination, during manufacturing, between manufacturing processes and prior to use.

An important function of such packaging is the protection of a product from contamination during the process of production or manufacturing between manufacturing steps. Such protection has become particularly critical for electronic circuit components which are often subject to damage from a wide range of environmental conditions including contamination by vapors and particles present in containers or evolved within those containers when an article is stored therein.

Maintaining clean conditions has become more important during recent years with the increase of storage and transportation of intermediate products for electronic devices which must be maintained in a clean condition when removed from the packaging for further processing. Further, the maintenance of an adequately clean manufacturing environment has led to increased manipulation of the packaging and items contained therein by automated processing equipment. Therefore, isolation structures used in such manufacturing processes must be adapted to be manipulated by such equipment in addition to providing the required types of protection for the packaged items. This adaptation often requires both the packaging and the automated equipment to be specially modified and standardized, increasing costs and reducing the generality of application of the automated equipment.

A Standard Mechanical Interface (SMIF) is described in U.S. Pat. Nos. 4,532,970 of Tullis et al for "Particle Free Dockable Interface for Integrated Circuit Processing" states at Col. 3, lines 50-64 that the SMIF box does "not utilize constantly moving filtered air to decrease particles on the IC wafer surfaces. Rather, IC cleanliness is achieved by maintaining a still-air interior environment." In summary, such SMIF interfaces are to be used with semiconductor wafers, to protect them from contaminants by preventing circulation of air about the wafers.

U.S. Pat. No. 4,724,874 of Parikh et al for "Sealable Transportable Container Having a Particle Filtering System" describes a filtering system and an air circulation system for at Col. 7, lines 57 et seq. "filtering and analyzing having an inlet . . . and an outlet . . . . Clean air or free $N_2$ is pumped by pump P into the interior space . . . , circulated through conduit tubing . . . and then exhausted through an outlet. A filter . . . for trapping any particles in the interior space . . . is provided at the outlet . . . . Additionally the inlet could also have a filter. Each of the inlet . . . and outlet . . . are one-way valves so that unwanted fluids can not enter the first environment . . . ."

This invention is based on a realization by the inventors of a need for a simpler structure which operates more quickly, with minimal interaction instead of more elaborate mechanisms used to perform such functions in the past. It would be desirable to be able to make a quick connection and quick removal of work from the purging station where articles in an enclosed chamber are to be purged of unwanted gases, etc., during storage, when off line from a manufacturing process.

It is therefore an object of the present invention to provide a system for quickly connecting and removing a source of purging gases to an isolation structure containing an item therein from contamination by particles or vapors generated either internally or externally of the isolation structure.

Still another object of this invention is automatically disconnecting the outlets and inlets of the purging system and the exhausting system when the closed container to be purged is removed.

In accordance with this invention, a reusable isolation enclosure has a closure member carrying filters and vapor and moisture drains. Replacement of ambient environmental gases in the sealed enclosure is provided. A replacement or inert gas is provided by the gas replacement system which quickly connects to the enclosure and quickly disconnects from the enclosure. Suction cups surrounding the ends of gas connection lines form the interface to the filter membrane and form a seal with the closure member. No other mechanical connection than the suction cups is required. The outlets and inlets of the purging system and the exhausting system are automatically disconnected by a spring valve when the isolation container to be purged is removed. When the closure member of the isolation enclosure is placed upon on the purge system the weight of the package overcomes the spring force and thus opens the valves and permits the replacement gas to flow. If the empty isolation enclosure is placed on the system the weight is insufficient to open the spring actuated valve system, therefore only enclosures carrying the weight of a product will be purged by the gas replacement system.

The solution in accordance with this invention can be used in the business of providing closed containers to the semiconductor industry, and this solution has applications in other areas beyond semiconductor products.

Further in accordance with this invention, an isolation structure includes a) a shell having a opening, b) a closure member dimensioned to be received within the opening, the closure member including i) a closure member body having an outer periphery and a resilient seal on the outer periphery of the closure member body, ii) a gas exchange system for the structure including (1) a gas inlet port for the structure having an inlet filter membrane, and (2) a gas outlet port for the structure having an outlet filter membrane, e) quick connection supply means for supplying a source of gas to be introduced to purge the chamber by means of a quick mechanical connection, f) the supply means including i) a spring actuated inlet valve with a self-sealing interface, and ii) a spring actuated outlet valve with a self-sealing interface adapted to for providing quick connection to the gas inlet port and the gas outlet port respectively. Preferably the means for locating at least one of the front plate and the back plate includes a pair of breather bodies containing the filter membranes; and the front plate has at least one aperture formed therein.

Preferably the closure member includes means for locating at least one of the front plate and the back plate relative to the backbone further includes a breather body.

In another aspect of the invention, a gas exchange system for a sealed chamber comprises the chamber, a) an inlet filter membrane in the wall of the chamber, b) an outlet filter membrane in the wall of the chamber, c) supply means having a source of a gas to be exchanged into the chamber, and d) an inlet line and an outlet line each being connected to the the supply means and each terminating in a self sealing connection to the inlet or outlet filter respectively.

In still another aspect of this invention, an isolation structure includes a) a shell having a opening, b) a closure member dimensioned to be received within the opening, the closure member including i) a closure member body having an outer periphery and a resilient seal on the outer periphery of the closure member body, ii) a gas exchange system for the structure including a gas port for the structure having a filter membrane, the port extending from the exterior to the interior of the structure, c) quick connection supply means including a spring actuated valve with a self-sealing interface adapted for providing quick connection to the gas port in response to the presence of an article in the chamber, preferably as a function of the contents of the chamber exceeding a predetermined weight. In short, the quick connection of the gas port is responsive to the weight of the article in the chamber.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

DETAILED DESCRIPTION OF A PREFERRED EMBODIMENT OF THE INVENTION

Figure 1:
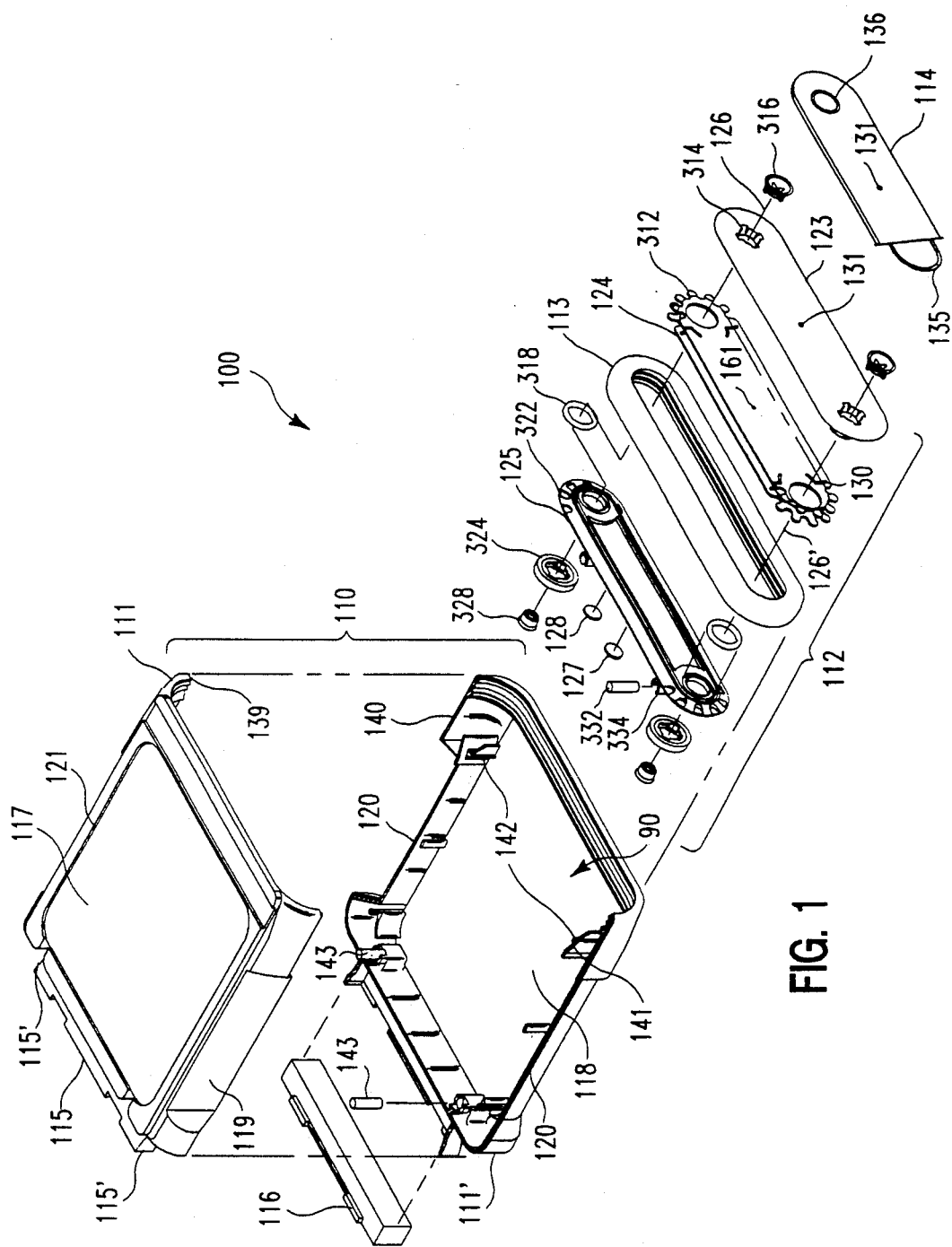
FIG. 1 is an exploded view of the isolation structure including a portion of a gas purge system in accordance with the invention.
Figure 2:
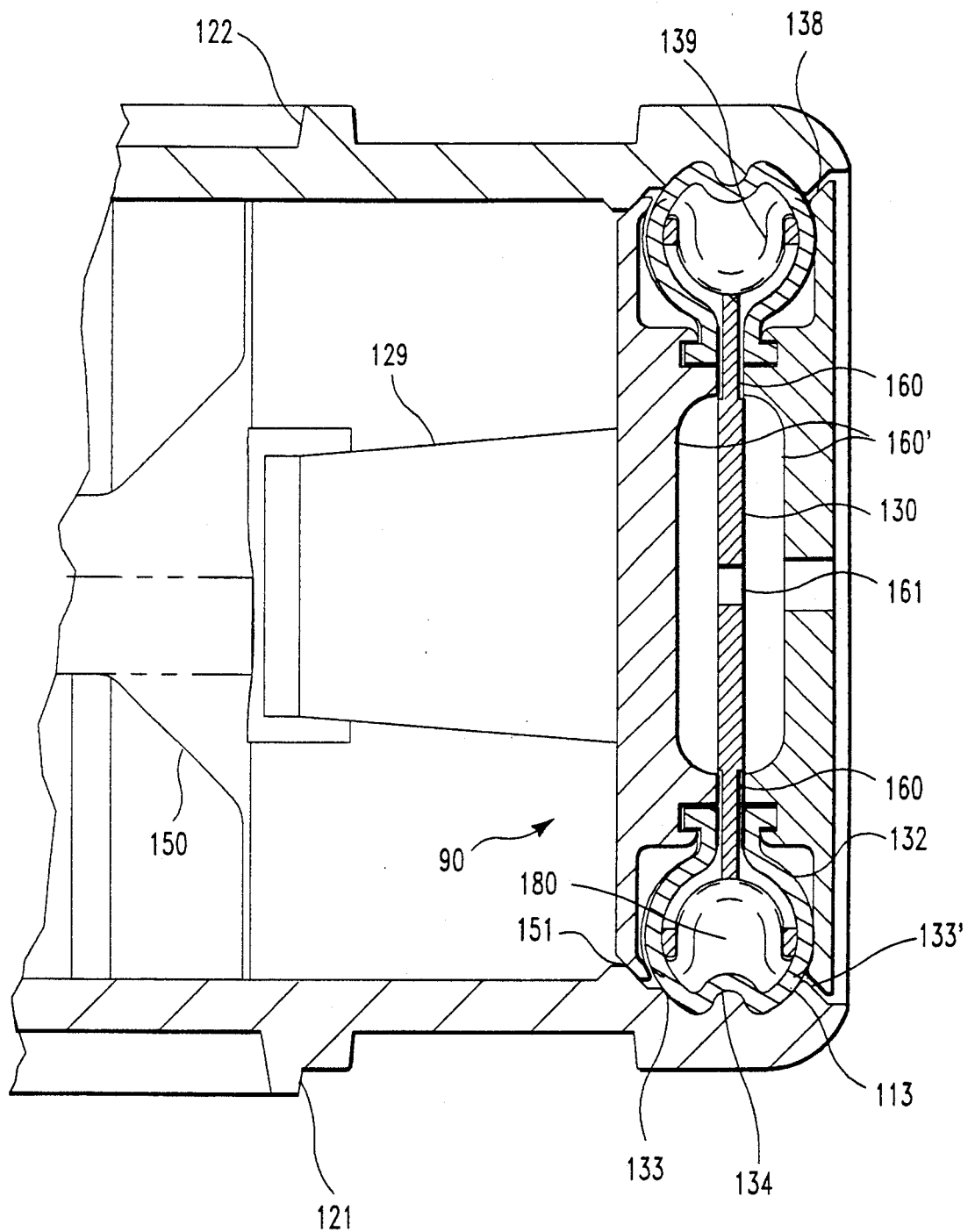
FIG. 2 is a cross sectional view of the closure member and seal structure of the isolation structure illustrated in FIG. 1, and including a portion of the shell of the isolation structure with the elements of the gas purge system of this invention not visible in this section.

Referring now to the drawings, and more particularly to FIGS. 1 and 2, there are shown, in an exploded view and a side elevational section respectively, the constituent components of an isolation structure 100 including portions of the gas purge system in accordance with the invention. The isolation structure 100 has two major parts, a shell 110 and a removable closure member 112 which fits into an opening 90 in the end of shell 110. Shell 110 can preferably be fabricated from two portions 111, 111' by casting, injection molding, machining, or any other suitable technique. If the shell 110 is so formed, the portions 111, 111' are preferably permanently joined by hot platen welding to provide a hermetic seal with no flash at the joint. However, other joining techniques and materials may be used such as adhesives as long as care is taken to avoid materials and formations which could form a source of loose particles or vapors (e.g. a solvent in an adhesive) which could be a source of contaminants. In any case, shell 110 portions 111, 111' are preferably formed with interlocking edge structures 139, 140 and possibly interlocking tabs such as 141 to enhance the structural integrity of the shell 110 o when the shell 110 portions 111, 111' are joined. Whatever technique or materials are utilized to join the shell 110 portions 111, 111', it is preferable that the full extent of such locating or interfitting structures be involved (e.g. a full depth weld) so that no internal crevices will remain after the shell 110 portions 111, 111' are joined.

The shell 110, when completed, has no moving parts or internal concave structures and thus may be easily cleaned. The major portion of the interior is preferably planar to facilitate cleaning and the opening 90 (doorway) into which the closure member 112 is to be fit is no smaller than the internal cross-sectional shape of the shell 110 interior, allowing brushes, nozzles or other devices to be brought into contact with all interior surfaces of the shell 110.

The planar major surfaces, such as 118, of the interior of the shell 110 also preferably cooperate with planar outer surfaces 117 to form viewing windows so that the contents of the isolation structure 100 may be inspected while maintaining isolation of the contents of structure 100 from the ambient atmosphere. For this reason, transparent materials are also preferred. Additionally, further viewing windows may be provided in the sides of the shell 110 such as at 119. It is preferable, if the shell 110 is formed in two portions 111, 111', to avoid having a joint between such portions crossing the side viewing windows. Therefore, window 119 is preferably formed on one of the portions 111, 111' and a corresponding notch 120 is formed on the other portion to receive an edge thereof. It is also possible to form any of the viewing windows 117, 119 as a separate structure around which two or more portions 111, 111' of the shell 110 are fitted However, since suitable transparent materials having low outgassing properties and low rates of shedding (e.g. loss of particles from the surface) are readily available, lowest cost is achieved by integral formation of the viewing windows in the shell 110 portions 111, 111'. Examples of such suitable materials are PC (Polycarbonate), PMMA (Poly(methtylemethacrylate) and PETG (Polyethylene terepthalate - glycol modified). These materials are also particularly suitable since with additives (such as static dissipative agents) they can be somewhat conductive and thus dissipate static electricity.

A stacking structure is provided, preferably in the form of a raised frame margins 121 and 122. The raised margins 121 and 122 are preferably dimensioned to be functionally combined with a stacking structure, as indicated at 121 and 122 in FIG. 2.

Shell 110 is also preferably formed with an external projection 115 which can be used to position the shell 110 during the insertion or removal of the contents thereof. The projection can also be used as a location for a process identification tag 116, preferably formed as an insert held between projections 115, or other identifying indicia. While no particular exterior dimensions or shapes are required for projection 115 or in combination with insert 116, it is considered preferable that the lateral ends 115' of projection 115 be angled, bevelled, rounded or otherwise shaped to facilitate gripping or handling of the shell 110 and separation of a set of stacked shells 110 when the shells are stacked as provided by the stacking structures 121 and 122.

The closure member 112 in accordance with the invention is a composite structure; the principal constituent parts of which are a closure member body, preferably including a backbone 124, and a resilient pneumatic seal member 113. The backbone 124 supports the general shape of the resilient seal to generally conform to the shape of the opening 90 in shell 110. The backbone 124 also preferably provides pneumatic manifolding 130 to communicate with the interior of the resilient seal member 113, as will be described in greater detail in copending application Ser. No. 07/950,110. The edges of the backbone 124 are also preferably cup-shaped in cross-section, as best illustrated at 132 of FIG. 2 to form an elongated toroidal interior volume when resilient seal member 113 is installed thereon. Accordingly, apertures are provided in the cup-shaped edge of backbone 124 in accordance with the manifolding structure utilized. It is to be understood that while providing manifolding within the closure member body is preferred, it is only necessary to be able to communicate pressure or partial vacuum to the interior space defined, in part, by the resilient seal and a closable opening, tube or other arrangement which could be provided directly on the resilient seal, itself.

With further reference to FIG. 2 as well as FIG. 1, to complete the major structure of the closure member 112, the closure member body preferably further includes front plate 123 and rear plate 125. As shown in FIG. 2, the front and rear plates 123, 125 clamp respective margins of resilient seal member 113 against outer sides of the cup-shaped edges 132 of the backbone 124. The front and rear plates 123, 125, in conjunction with the backbone 124, also mechanically constrain the resilient seal and provide controlled collapse of the seal when the interior volume is evacuated. The "interior volume" to be evacuated includes spaces 170 and 180 in hollow closure member 112 as well as the pneumatic manifolding 130. The space 170 is the space between the front plate 123 and the back plate 125. The space 180 is defined by the volume between the pneumatic seal member 113 and the cup-shaped edge of the closure member backbone 124. Of course, it is to be understood that this definition of the "interior volume" is directed to the particular shapes and topologies of the constituent parts of the preferred embodiment of the invention and basically includes all interior space of the closure member 112 which is in communication with the interior 180 of the resilient seal member 113, thus constituting "manifolding" regardless of its configuration. It should also be understood that the "manifolding" may, in fact, occupy only a very minor fraction of the interior space which may exist in the closure member 112.

Figure 3:
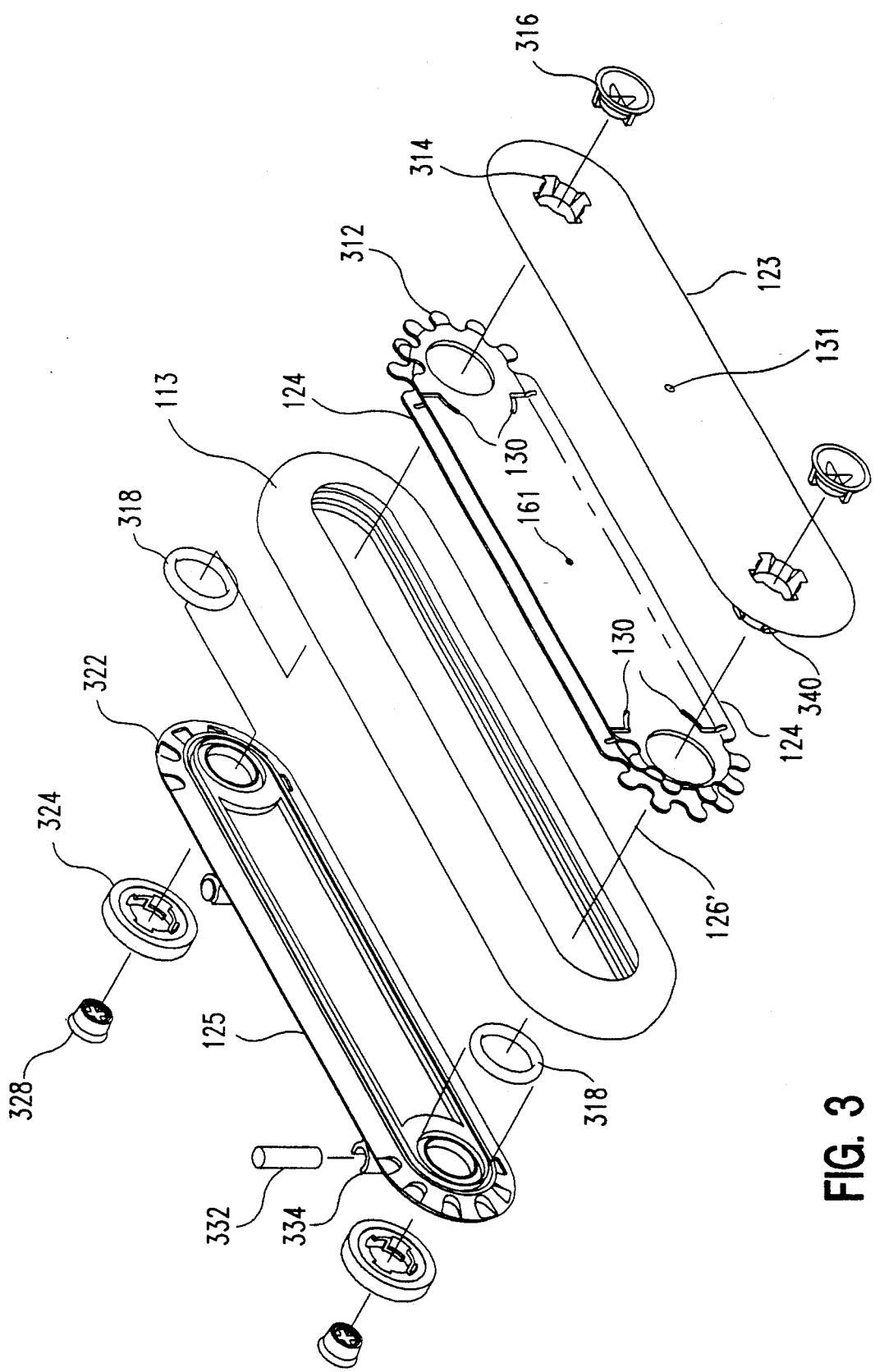
FIG. 3 is an exploded view of an alternative embodiment of the closure member structure in accordance with the invention showing some preferred features thereof with the filters and inlets and outlets for the gas purge system of this invention illustrated.

Location of the front and rear plates 123, 125 relative to the backbone 124 is preferably facilitated by cylindrical housings 340 (only one of which is shown by cutting away the edge of the front plate 123 in FIG. 3) secured to the back of front plate 123 centered on center lines 126 and 126' respectively. Cylindrical housings 340 extend through holes in the backbone 124 and back plate 125, which holes are also aligned with center lines 126 and 126' respectively. On the back side of back plate 125, the retaining nuts 324 are pushed over the ends of cylindrical housings 340, so nuts 324 lock onto cylindrical housings 340 by turning them into a locked position as is well-understood by those skilled in the art.

Alternatively, the front and back plates 123, 125 and the backbone 124, together with other closure member 112 structure can be joined together by pins extending from either or both of the front and back plates 123, 125 and/or backbone 124 and welded, bonded or otherwise affixed at the front and back plates 123, 125 to secure the closure member 112 assembly together. Also, as best shown in FIG. 2, the edges of the front and back plates 123, 125 are preferably shaped to closely engage the margins of the resilient seal member 113 which are preferably angled to give the resilient seal an overall appearance, in cross-section, of the Greek letter "Ω". This structural configuration provides a particularly gas-tight seal between these parts, allowing the seal to be pressurized and such pressure maintained for extended periods of time to tightly seal the closure member 112 of isolation structure 100.

Front plate 123 also has an aperture 131 cooperating with the manifolding provided by backbone 124 to allow the interior of the resilient seal to be pressurized or evacuated. At least the front surface of the front plate 123 also preferably provides a flat surface for facilitating engagement by a vacuum closure member removal plate 114 which will be discussed below. The backbone 124 and front and back plates 123, 125 are preferably formed of the same material as the shell 110. However, transparency is not normally required, providing slightly greater latitude in choice of materials.

Manifolding 130 can be fabricated in many forms, such as with tubes or hollow structures within the backbone 124. However, an extremely simple preferred structure may be formed simply as grooves or recesses in the sides of the backbone 124 (indicated at 160) or the abutting faces of the front and/or rear plates 123, 125 (indicated at 160'). The manifolding is preferably formed on both sides of the backbone 124 with at least one communicating hole 161 through the web of the backbone 124. Corresponding holes are also formed at the locations of the grooves in the cup-shaped edges of the backbone 124. Thus the grooves serving as pneumatic manifolding 130, in cooperation with the abutting inner faces of the front and rear plates 123, 125 complete a manifold which can communicate a desired pressure or vacuum from opening 131 on a preferably smooth or flush outer surface of the front plate 123 to the interior of the resilient seal member 113. The pressure or partial vacuum in the interior of the resilient seal member 113 can be maintained by providing appropriate closure for opening 131.

Front and rear plates 123, 125 and backbone 124 also have apertures for receiving a filter 328 and in a breather body 316 aligned along centerline 126 in FIG. 3 to allow equalization of pressure between the interior and exterior of the shell 110 without the introduction of particulate contaminants. The shell 110 may also be purged with a gas such as an inert gas after sealing of the shell 110 by closure member 112 by means of breather 316. However, it is preferable to provide at least two such breather bodies 316 with filters 328 to allow a gas to be more readily circulated throughout the shell 110.

Rear plate 125 is also preferably provided with a hygroscopic body 128 and a vapor absorptive body 127 affixed thereto, referred to hereinafter as drains. These absorptive bodies and filter 328 are readily removable from the assembled closure member 112 prior to cleaning. New filters and drains are fitted to closure member 112 when the closure member 112 is to be reused.

Also, as best shown in FIG. 2, the opening 90 of the shell 110 has the overall form of a groove between an interior shoulder 133 and a similar exterior shoulder 133' around the entire periphery thereof. These shoulders are of a dimension which does not reduce the outline of the opening 90 beyond the cross-sectional dimensions of the interior of the shell 110. The groove also preferably is shaped to include a preload ridge 134 to enhance the sealing effect against resilient seal member 113.

Shell 110 may also be fitted with a liner 150 which may function as a guide or holder for items placed therein. This liner preferably has a tapered edge 151. Alternatively, such a tapered region could be formed integrally with shell 110 or shell 110 portions 111, 111'. The rear plate 125 of closure member 112 is also preferably tapered to cooperate therewith to provide a smooth interior surface of the isolation structure 100.

A tapered edge 138 is also formed on the periphery of front plate 123 to cooperate with an outer portion of the profile of outer shoulder 133'. This tapered region provides a periphery of the front plate 123 which is larger than the periphery of resilient seal member 113 when retracted by evacuation, as shown by dashed lines 137, to reduce the risk of damage thereto. Further, when the resilient seal member 113 is pressurized or otherwise allowed to resiliently expand, the seal exerts a camming action against the inner portion of the profile of outer groove shoulder 133' until the tapered edge of the front plate 123 is seated against the outer portion of the profile of shoulder 133'. At the same time, the tapered edge of the rear plate 125 is seated against the tapered region 151. This interfitting of surfaces provides a particularly secure positioning of the closure member 112 within the opening 90 and, in particular, prevents the closure member 112 from being pushed inward to apply mechanical forces against items contained within the isolation structure 100. This seating of tapered structures also assures that the interior dimensions of the isolation structure 100 will not be altered by the seal member 113 or changes in the condition thereof.

Rear plate 125 is also preferably provided with a resilient buffer member 129, which is preferably dimensioned to apply a slight positioning force against an item placed in the isolation structure 100 when the closure member 112 is in place. Opposing positioning forces are applied to the item by resilient buffers 143, shown in FIG. 1. The opposing resilient pads thus provide substantial protection of the item against impacts applied to the isolation enclosure. Preferably the material chosen for these resilient buffers also provides a damping effect and thus provides protection against vibration being transmitted from the exterior of the isolation structure 100 to the contents thereof. Suitable materials include Fluoro (FLUOREL(®)), Urethane (ELASTILAN(®)), Polyester (ELASTILAN(®)) or Buna-N (DYEL(®)).

In order to seal or open the isolation structure 100, a vacuum plate 114 is preferably used. In order to capture and manipulate the closure member 112, the vacuum plate 114 must include a raised resilient seal 135 (e.g. an O-ring or suction cup) which is preferably located to surround the location of aperture 131 in order to conveniently evacuate the resilient seal member 113 through manifolding 130 in the structure of backbone 124. It is especially preferable for raised resilient seal 135 to extend around the entire periphery of the vacuum plate 114. This location provides the optimum application of frictional engagement forces between the raised resilient seal 135 and the front plate 123 of the closure member 112 for manipulation thereof. However, about the location of the raised resilient seal 135, one or more further, similar seals must be provided to prevent vacuum from being applied to the interior of the isolation structure 100 through a breather, which may preferably be an assembly of several elements indicated by center line 126. This is preferably done by providing O-ring seals 318 and 136 (shown in phantom in FIG. 1), as will be discussed in greater detail below.

Further, for opening of the isolation structure 100 after the outer surface thereof has been exposed to contamination, this location of the raised resilient seal 135 provides a sealed chamber to contain the contamination. Any contamination present cannot escape the chamber due to the vacuum applied. This feature considerably reduces the difficulty of maintaining clean processing conditions within processing apparatus. For example, the shell 110 of the isolation structure 100 need not be introduced into processing equipment but merely placed against an aperture in a cover thereof. A contaminated cover could be withdrawn and the contamination fully contained by automated mechanisms within the processing apparatus while the contents of the isolation structure 100 are removed. The cover could then be replaced and the contaminated isolation structure 100 removed and the processing apparatus cover resealed with little or no opportunity for contamination of the interior of the processing apparatus to occur.

Referring now to FIG. 3, a preferred structure for several of the constituent parts of closure member 112 will be described. A preferred form of backbone 124 includes a toothed periphery at the rounded ends thereof. This toothed structure such as teeth 312, provide gaps which improve gripping and sealing of the margin of resilient seal member 113. It should be noted in this regard that a suitable resilient seal made of an elastomeric material is commercially available but is shaped in a generally circular rather than an elongated oval form. Straightening the curvature of this commercially available seal 318 along the linear portions of the backbone 124 stretches the inner periphery and does not affect the sealing action between the backbone 124 and the front and rear plates 123, 125. However, where the curvature is increased, the inner margin is compressed. Therefore, the teeth 312 are advantageous in accommodating the compressed material in these regions while gripping the resilient seal against corresponding ribs 322 between recesses formed in the front and rear plates 123, 125. It is considered preferable that the ribs 322 and teeth 312 be opposed to each other rather than interleaved since the serpentine shape into which the seal margin would be forced, in the latter case, provides an inferior seal and concentrates forces during insertion of the closure member 112 into the shell 110 opening 90 which could tear or otherwise degrade the resilient seal.

A preferred structure for the resilient buffers 129 is formed by insertion of cylindrically shaped buffers 332 into brackets 334 which may be formed integrally with or attached to the rear surface of rear plate 125. Buffers 332 are preferably force fit into these brackets 334 so that the resilient material thereof will be retained therein and also deformed slightly to protrude in the direction of application of force to the contents of the isolation structure 100.

A preferred form of the breather 126, 316 is also shown in FIG. 3 which also performs the function of locating pins 125' of FIG. 1. Breather body 316, which is generally cone-shaped, is provided which preferably has protrusions thereon which key into notches 314 in apertures formed in front plate 123. The breather body thus reaches through all of the front plate 123, backbone 124 and rear plate 125. An O-ring seal 318 is provided around the breather body 316 within apertures in the backbone 124. Thus when the breather body 316 is placed in tension, preferably by the installation of a quarter-turn nut affixed thereto, the O-ring 316 is flattened and deformed against the interior of the aperture in the backbone 124 while maintaining a slight separation of the front and rear plates 123, 125 therefrom until the parts are fully seated against each other and in engagement with resilient seal member 113. In this fashion, the front and rear plates 123, 125 and the backbone 124 are made self-aligning during assembly. Filter elements 328 are then carried by the interior surfaces of the breather body 316.

The closure member 112 of the isolation structure 100 is preferably operated by capturing the closure member 112 with a vacuum plate 114 of the form discussed above after removing any closure of opening 131, if necessary. The application of a partial vacuum to the surface of the front plate 123 is also communicated through manifold 130 to the interior of resilient seal member 113 which then assumes the shape indicated at 137. The closure member 112 can then be easily seated or removed, as desired.

The ends of the cup-shaped edges of the backbone 124 are preferably dimensioned to provide a sliding fit over groove shoulder 133'. While some wear on the resilient seal will occur unless a clearance is provided, a sliding contact will provide the most secure closure and seal of the closure member 112. Any significant wear which occurs will be easily detectable by inspection. Further, a two-step, detent-like action will be provided by the ends of the cup-shaped edges of the backbone 124 which can be sensed by automated equipment to indicate proper closure of the closure member 112. The detent action will also hold the closure member 112 in a correct position relative to shell 10 while the resilient seal is allowed to expand or is pressurized.

It should be noted that when the closure member 112 is correctly seated, there are no grippable projections on either the surface or the edges of the closure member 112. The preferably bevelled or tapered edges of the closure member 112 are closely fitted to and slightly recessed below the edge of shell 110. The resiliency of the resilient seal member 113 at the edges of the backbone 124 and front and rear plates 123, 125 is preferably chosen such that it cannot be collapsed by evacuation which is less than the partial vacuum required to firmly grip the closure member by vacuum plate 114.

Figure 4:
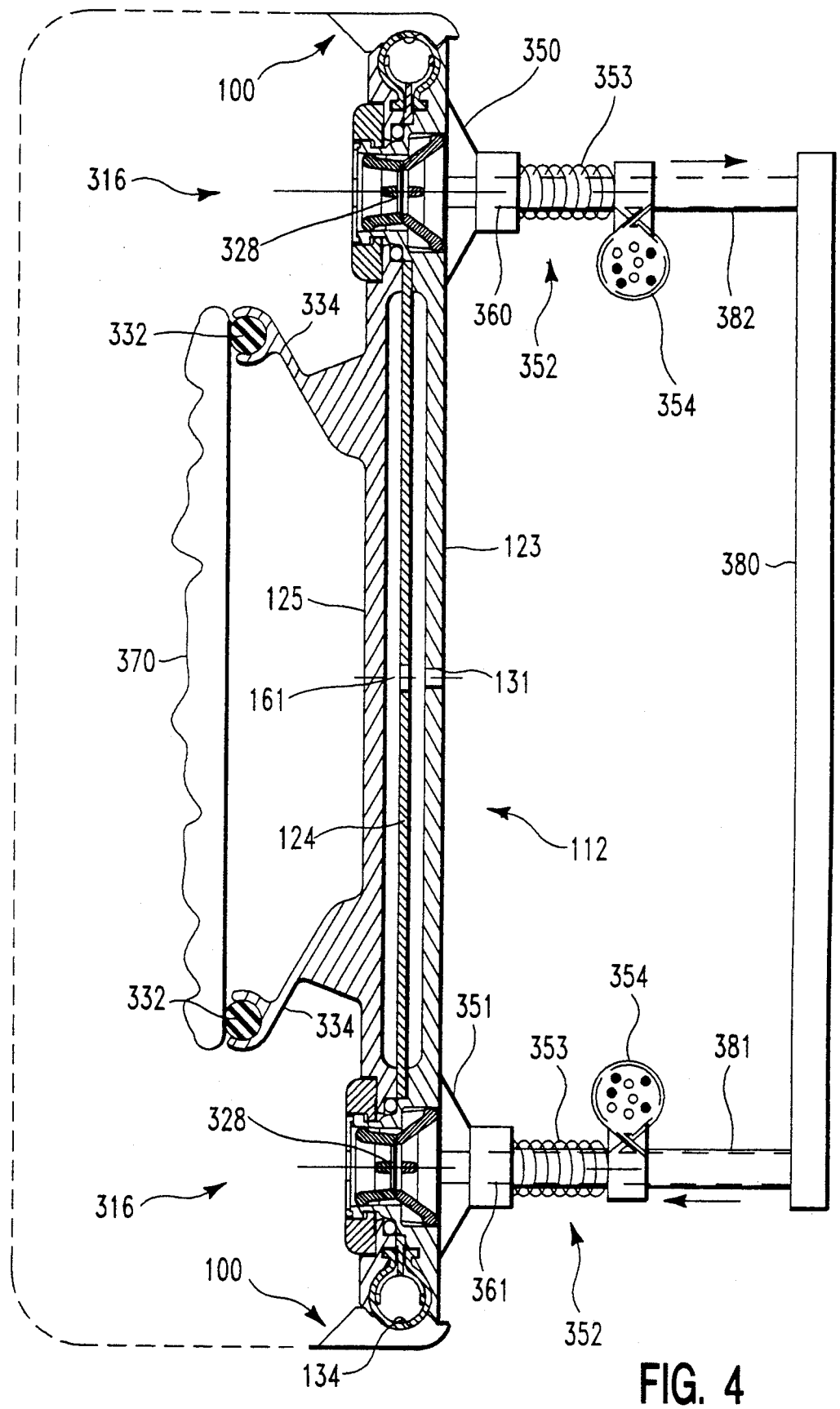
FIG. 4 is a cross sectional view of a closure member in accordance with this invention illustrating the gas purge system of the invention.

FIG. 4 shows an embodiment of the gas purge system of this invention in detail, with the closure member 112 turned with its broad side facing the view and with its front turned on edge, facing downwardly. In this embodiment a plug-in system is provided capable of connecting the internal space within the isolation enclosure (containment chamber) with external gas lines in a fashion preventing contaminants from entering the chamber. The gas purge system in accordance with this invention is particularly adapted to be used when the enclosure 100 is filled with an article 370 (shown in fragmentary form for convenience of illustration) The article 370 is to be stored for an indefinite, frequently short interval of time which nevertheless requires protection by purging the gas surrounding the article 370 being stored in the enclosure 100. The article 370 is shown resting upon cylindrical buffer pads 332 secured to the closure member 112 by means of brackets 334. Thus the weight of article 370 is supported by closure member 112, pressing downwardly to provide the force required to operate valves to introduce purging gases into the chamber of enclosure 100, as will be explained in detail below. Fragments of the opening 90 of sealed isolation enclosure 100 of FIGS. 1-3 are shown (with the remainder cut away for convenience of illustration) with the closure member 112 sealed therein. In the closure member 112 the two filter membranes 328 are located in breather bodies 316 which extend through closure member 112. The closure member 112 and the weight of enclosure 100 and article 370 are supported by the purge system of this invention by means of two suction cups 350, 351. The suction cups 350, 351 have coaxial holes 360, 361 respectively therethrough at the center of the cups 350, 351. The cups are supported reciprocally by two spring actuated flow valves 352 which open when sufficient weight is pressed down upon them by the weight of the enclosure 100 and its contents, but which remain closed when the enclosure 100 is empty. The interior passageways of the valves 352 are connected to the holes 360, 361 in cups 350, 351 to permit flow of air therethrough, when the valves 352 are open. Clean gases can be introduced without any unwanted materials being admitted because the suction cups 350 close off connection with ambient air. Valves 352 are normally closed preventing the source of fresh inert gas from flowing until the suction cups 350, 351 on the bottom of FIG. 4 are forced down by the weight of the closure member 112 in the "plugged in" position. That is valves 352 are spring biased closed by springs 353. Spring constants can be varied based upon the weight of the closure member 112, the enclosure 100 and the article 370 to permit the valves to open, but to remain closed in the absence of the article 370. The outlet lines from valves 352 are terminated in the suction cups 350. Two flow indicators 354 are also supplied connected to the opposite ends of valves 352 from the cups 350, 351.

Figure 5A:
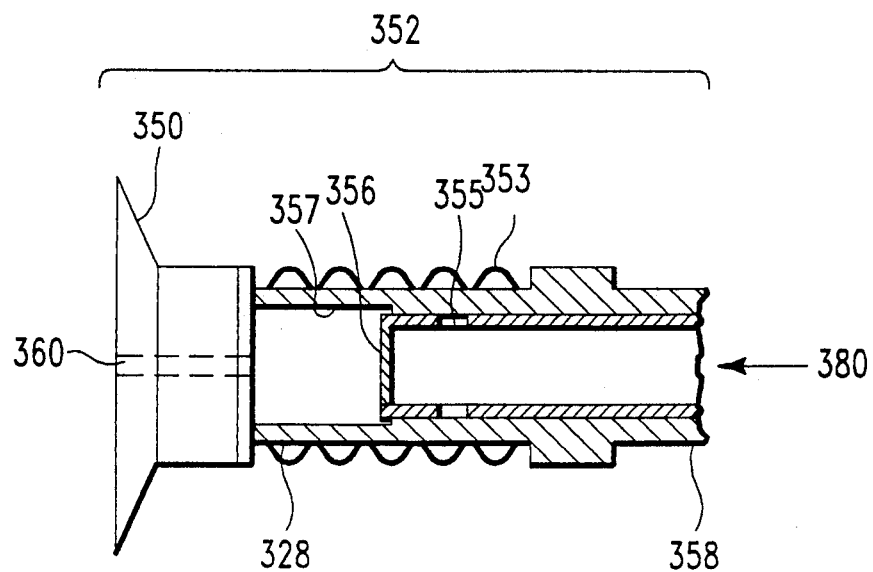
FIGS. 5A and 5B show a partially sectional view of a valve mechanism useful in connection with the current invention in the closed and open conditions respectively.
Figure 5B:
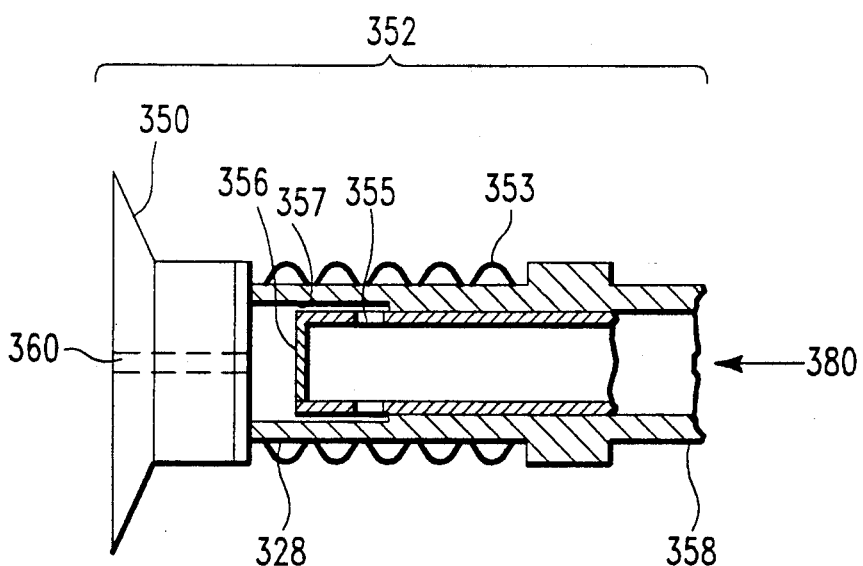

The details of one of the valves 352 are shown in FIG. 5A and FIG. 5B for the valve 352 connected to suction cup 350. Valve 352 includes two hollow cylinders 356 and 358, with one carried slideably inside another. The interior cylinder 356 has the supply gas connected to it at inlet 380, and is capped off at the top. The interior cylinder 356 has a side opening (hole) 355 which is normally covered by the exterior cylinder 358, under the force of biasing spring 353. The exterior cylinder 358 is connected to the suction cup 350 or 351. When the suction cups 350, 351 are plugged onto the closure member 112, a spring 353 is depressed moving the interior cylinder 356 up and uncovering the side opening where the exterior cylinder has a counterbore 357 providing a larger diameter permitting gases to pass, thereby allowing gas flow into the exterior cylinder 358 chamber. The gas flow goes through a hole 360 in the suction cup 350 (or 351) and through the filter membrane 328. The same is true on both the inlet and the exhaust side. The suction cups 350, 351 are mechanically connected to the exterior cylinders 358.

At the other end of each valve 352 is located a flow indicator 354 and line 381 from source 380 of fresh inert gas with a return line 382 exhausting gas into source 380 for reprocessing or exhaust as will be well understood by those skilled in the art.

The flow indicators measure the flow of gas through valves 352 from line 381 into suction cup 351 and out of suction cup 350 into line 382. Gas can pass through the holes 361 in cone 351 through one filter membrane 328 to the interior of the isolation enclosure (pod) 100. Then the gas flows out of the other filter membrane 328 through hole 360 in cone 350 so the enclosure 100 is purged and exhausted of the gas contained therein. If the enclosure is "unplugged" from the inert gas flow from line 381 and cup 351, the inert environment remains in the isolation enclosure 100 for a period of time to be determined empirically as will be well understood by those skilled in the art on the order of hours in most instances. If the user is concerned about maintaining the inert environment in the isolation enclosure 100 for long periods of time (days) without any purging gas the isolation enclosure 100 can be plugged into closed off suction cups 350, 351 that seal around the filter and do not permit exhaust. Under ambient conditions for relatively short intervals, the pressure differential is the same and no significant amount of exchange takes place between the environment of the isolation enclosure 100 and the exterior environment.

The "Plug In" system of the invention permits an exchange of gas with a very simple and low cost approach. When the isolation enclosure is set on the purge system the weight of the product opens the valves and permits flow. The suction cups form the interface to the filter membrane and seal to the closure member 112. No mechanical connection is required. If the empty isolation enclosure is placed on the system the weight is insufficient to open the spring actuated valve system, therefore only enclosures with product will be purged. The flow meters on the system indicate flow and flow velocity.

Gas can pass through the filter membranes to purge and exhaust the interior of the pod. If the enclosure is "unplugged" from the inert gas flow, the inert environment would remain in the isolation enclosure for a period of time to be determined (hours). If the user is concerned about maintaining the inert environment in the isolation enclosure for long periods of time (days) the isolation enclosure can be plug into closed suction cups that seal around the filter and do not permit exhaust. At ambient the pressure differential is the same and exchange does not take place between isolation enclosure environment and exterior environment.

Purging and exhausting a closed container has always been a challenge. The solution could be used by companies who are in the business of providing closed containers to the semiconductor industry. This solution has applications in other areas beyond the semiconductor industry.

The "Plug In" system shown in FIGS. 4 and 5 permits an exchange of gas with a very simple and low cost approach. When the closure member 112 of the isolation enclosure is placed upon on the purge system the weight of the package opens the valves and permits flow, as described above. The suction cups form the interface to the filter membrane 328 and form a seal with the closure member 112. No mechanical connection is required. If the empty isolation enclosure is placed on the system the weight is insufficient to open the spring actuated valve system, therefore only enclosures with product will be purged. The flow meters on the system indicate flow and flow velocity.

FIGS. 5A and 5B show a partially sectional view of a valve mechanism useful in connection with the current invention. The details of the valve are essentially two hollow cylinders one inside another. The interior cylinder has the supply gas connected to it. The interior cylinder has a side opening (hole) which is normally covered by the exterior cylinder. The exterior cylinder is connected to the suction cup. When plugged, a spring is depressed moving the interior cylinder up and uncovering the side opening allowing flow into the exterior cylinder chamber. The flow goes through a hole in the suction cup and through the filter membrane. The same is true on the exhaust side. The suction cups are mechanically connected to the exterior cylinder. For long term storage the boxes are purged with nitrogen or argon from a pressurized source.

While this invention has been described in terms of the above embodiment, those skilled in the art will recognize that the invention can be practiced with modifications within the spirit and scope of the appended claims.

Having thus described the invention, what is claimed as new and desirable and desired to be secured by Letters Patent is as follows:

1. An isolation structure including
   a) a shell having an opening,
   b) a closure member dimensioned to be received within said opening, said closure member including
      i) a closure member body having an outer periphery and a resilient seal on said outer periphery of said closure member body, and
      ii) a gas exchange system for said structure including
         (1) a gas inlet port for said structure having an inlet filter membrane, and
         (2) a gas outlet port for said structure having an outlet filter membrane,
   e) quick connection supply means for supplying a source of gas to be introduced to purge said chamber by means of a quick mechanical connection,
   f) said supply means including
      i) a spring actuated inlet valve with a self-sealing interface, and ii) a spring actuated outlet valve with a self-sealing interface for providing quick connection to said gas inlet port and said gas outlet port respectively.

2. An isolation structure as recited in claim 1, wherein said closure member body includes a resilient seal, a backbone, and front and rear plates cooperating with said backbone for constraining said resilient seal, and further includes means for locating at least one of said front plate and said back plate relative to said backbone, wherein said means for locating at least one of said front plate and said back plate includes a pair of breather bodies containing said filter membranes.

3. An isolation structure as recited in claim 2, wherein said front plate has at least one aperture formed therein.

4. An isolation structure as recited in claim 2 wherein a flow indicator for measuring the rate of flow of gas through said quick connection means is in fluid communication with said quick connection means.

5. An isolation structure as recited in claim 1 wherein a flow indicator for measuring the rate of flow of gas through said quick connection means is in fluid communication with said quick connection means.

6. An isolation structure adapted to receive an article including
   a) a shell having an opening,
   b) a closure member dimensioned to be received within said opening, said closure member including
      i) a closure member body having an outer periphery and a resilient seal on said outer periphery of said closure member body, and
      ii) a gas exchange system for said structure including a gas port for said structure having a filter membrane, said port extending from the exterior to the interior of said structure,
   c) quick connection supply means including a spring actuated valve with a self-sealing interface adapted for providing quick connection to said gas port in response to the presence of an article in said chamber.

7. An isolation structure as recited in claim 6 wherein said valve of said quick connection supply means operates in response to the weight of said article in said chamber.

8. An isolation structure as recited in claim 7 wherein a flow indicator for measuring the rate of flow of gas through said quick connection means is in fluid communication with said quick connection means.

9. An isolation structure as recited in claim 6 wherein a flow indicator for measuring the rate of flow of gas through said quick connection means is in fluid communication with said quick connection means.

10. An isolation structure as recited in claim 6 wherein said quick connection supply means is responsive to the weight of said article in said chamber.

11. A gas exchange system for a sealed chamber having an outer wall comprising,
   a. an inlet filter membrane in the wall of said chamber,
   b. an outlet filter membrane int he wall of said chamber,
   c. supply means having a source of a gas to be delivered into said chamber, and
   d. an inlet line and an outlet line each being connected to said supply means and each terminating in a self sealing connection to one of said inlet filter and said outlet filter whereby said gas is delivered into said chamber through said inlet filter forcing any gas contained therein to be exhausted through said outlet filter.

12. A gas exchange system as recited in claim 11 wherein a flow indicator for measuring the rate of flow of gas through at least one of said inlet line and said outlet line is in fluid communication with said inlet line and said outlet line.

* * * * *